(12) United States Patent
Choi et al.

(10) Patent No.: US 8,362,455 B2
(45) Date of Patent: Jan. 29, 2013

(54) STORAGE NODE OF A RESISTIVE RANDOM ACCESS MEMORY DEVICE WITH A RESISTANCE CHANGE LAYER AND METHOD OF MANUFACTURING THE SAME

(75) Inventors: Sang-jun Choi, Yongin-si (KR);
Jung-hyun Lee, Yongin-si (KR);
Hyung-jin Bae, Seoul (KR); Chang-soo Lee, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 842 days.

(21) Appl. No.: 12/003,136

(22) Filed: Dec. 20, 2007

(65) Prior Publication Data
US 2008/0169459 A1    Jul. 17, 2008

(30) Foreign Application Priority Data
Jan. 12, 2007  (KR) .................. 10-2007-0003964

(51) Int. Cl.
*H01L 45/00*    (2006.01)

(52) U.S. Cl. ......... 257/4; 257/2; 257/E45.003; 438/102; 438/104

(58) Field of Classification Search ........ 257/4, E45.003, 257/2; 438/102, 104
See application file for complete search history.

(56) References Cited

U.S. PATENT DOCUMENTS

| | | | |
|---|---|---|---|
| 6,849,891 B1 | 2/2005 | Hsu et al. | |
| 7,129,133 B1 * | 10/2006 | Avanzino et al. | 438/244 |
| 2004/0159835 A1 * | 8/2004 | Krieger et al. | 257/40 |

FOREIGN PATENT DOCUMENTS

| | | |
|---|---|---|
| JP | 2001-237380 | 8/2001 |
| KR | 10-2005-0074328 | 7/2005 |
| KR | 10-2006-0023860 | 3/2006 |

* cited by examiner

*Primary Examiner* — Lynne Gurley
*Assistant Examiner* — Vernon P Webb
(74) *Attorney, Agent, or Firm* — Harness, Dickey & Pierce

(57) ABSTRACT

Provided are a resistive random access memory device and a method of manufacturing the same. The resistive random access memory device includes a switching device and a storage node connected to the switching device, and the storage node includes a first electrode and a second electrode and a resistance change layer formed of $Cu_{2-x}O$ between the first electrode and the second electrode.

25 Claims, 4 Drawing Sheets

STORAGE NODE OF A RESISTIVE RANDOM ACCESS MEMORY DEVICE WITH A RESISTANCE CHANGE LAYER AND METHOD OF MANUFACTURING THE SAME

This U.S. non-provisional patent application claims the benefit of priority under 35 U.S.C §119 of Korean Patent Application No. 10-2007-003964, filed on Jan. 12, 2007, in the Korean Intellectual Property Office (KIPO), the disclosure of which is incorporated herein in its entirety by reference.

BACKGROUND

A resistive random access memory (RRAM) operates according to a characteristic of a resistance changing material, such as a transition between a metal and an oxide. In a resistance changing material, the resistance may change according to an applied voltage. For example, when a voltage equal to or higher than a set voltage is applied to a resistance changing material, the resistance of the material may decrease. This state of decreased resistance is referred to as an ON state. When a voltage equal to or higher than a reset voltage is applied to the resistance changing material, the resistance of the material may increases. This state of increased resistance is referred to as an OFF state.

Conventional resistive random access memory (RRAM) devices may include, for example, a nickel oxide ($NiO_x$) layer as a resistance change layer in the storage node.

FIG. 1 is a graph showing a current-voltage characteristic of a conventional RRAM. Referring to FIG. 1, the horizontal width of area A of the conventional RRAM has a wide range of voltage in which a resistance status starts to change.

It is desirable that a resistance change layer should have the same resistance status at the same applied voltage, which is not the case for conventional RRAMs. That is, when the distribution of voltages that cause a resistance change is too broad, it may be difficult to detect a change of resistance of the resistance change layer in a limited range of voltage. Thus, the reliability of the data read from the conventional RRAM may be low.

In addition, the resistance change layers of conventional RRAMs may be formed by a reactive sputtering method in which $O_2$ gas is often used as a reactive gas. However, such a reactive sputtering method is complicated, and the resistance change layer formed by the reactive sputtering method may have low reproducibility characteristics.

SUMMARY

Example embodiments may provide a resistive random access memory device having a resistance change layer that has a narrow distribution range of voltages for causing a resistance change, and excellent reproducibility. Example embodiments also provide a method of manufacturing the resistive random access memory device having such qualities.

According to an example embodiment, a resistive random access memory device may include a switching device, and a storage node connected to the switching device. The storage node may include a first electrode and a second electrode, and a resistance change layer formed of $Cu_{2-x}O$ between the first electrode and the second electrode, for example. The X in the $Cu_{2-x}O$ may be in a range of $0 \leq X \leq 0.5$.

In example embodiments, at least one of the first electrode and the second electrode may be selected from a TiN layer, a TaN layer, a Pt layer, an Al layer and a Ru layer.

The crystal orientation of the resistance change layer may be the same as the crystal orientation of at least one of the first electrode and the second electrode.

According to an example embodiment, a method of manufacturing a resistive random access memory device that includes a switching device and a storage node connected to the switching device, may include forming the storage node, wherein the forming the storage node includes forming a first electrode, forming a $Cu_{2-x}O$ layer on the first electrode, and forming a second electrode on the $CU_{2-x}O$ layer, for example.

The $Cu_{2-x}O$ layer may be formed by an RF sputtering method.

$Cu_2O$ may be used as a target material in the RF sputtering method.

Ar gas or a mixed gas of Ar gas and $N_2$ gas may be used in the RF sputtering method.

The X of the $Cu_{2-x}O$ layer may be in a range of $0 \leq X \leq 0.5$.

At least one of the first electrode and the second electrode may be formed of any of TiN, TaN, Pt, Al and Ru.

At least one of the first electrode and the second electrode may be formed by a CVD or PVD method.

BRIEF DESCRIPTION OF THE DRAWINGS

The above and other features and advantages of example embodiments will become more apparent by describing in detail the example embodiments with reference to the attached drawings in which.

DETAILED DESCRIPTION OF EXAMPLE EMBODIMENTS

Figure 1:
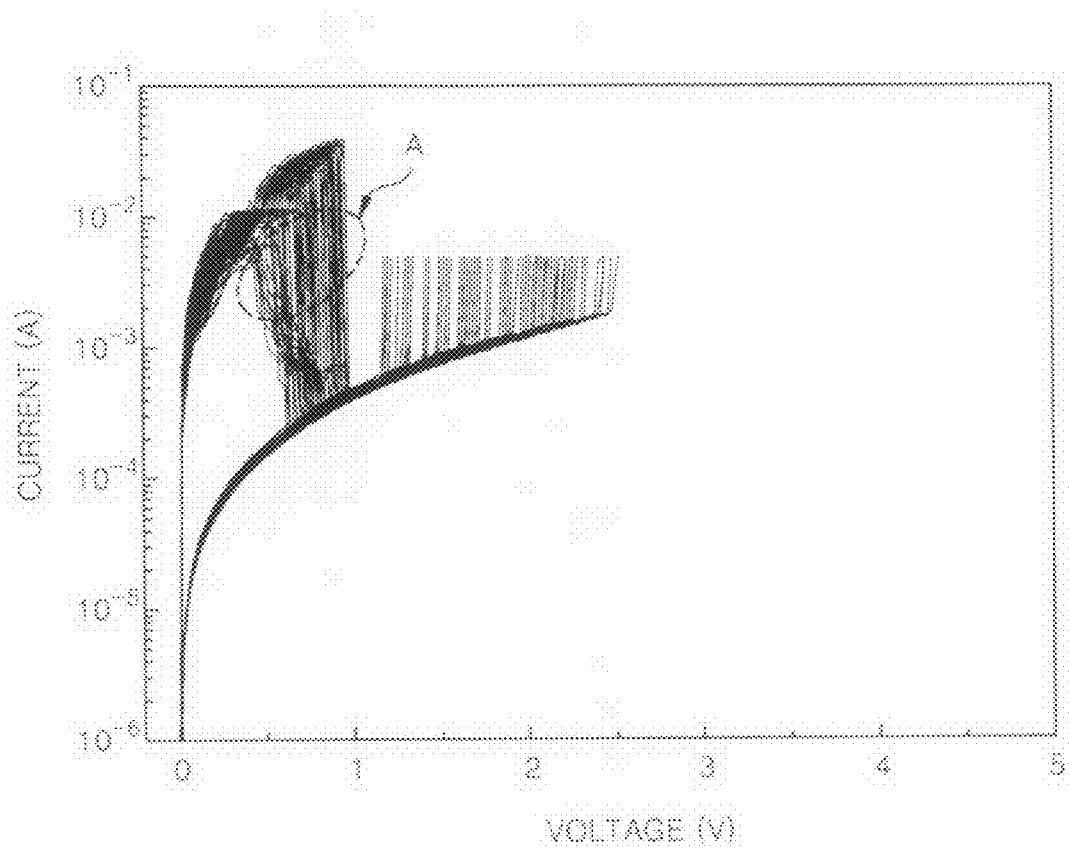
FIG. 1 is a graph showing a current-voltage characteristic of a conventional resistive random access memory (RRAM) device.

Various example embodiments will be described with reference to the accompanying drawings, in which some example embodiments are shown. Thicknesses of layers or regions illustrated in the drawings are exaggerated for better understanding.

Detailed illustrative embodiments are disclosed herein. However, specific structural and functional details disclosed herein are merely representative for purposes of describing example embodiments. The example embodiments may, however, may be embodied in many alternate forms and should not be construed as limited to only the embodiments set forth herein.

Accordingly, while the example embodiments are capable of various modifications and alternative forms, embodiments thereof are shown by way of example in the drawings and will herein be described in detail. It should be understood, however, that there is no intent to limit example embodiments to the particular forms disclosed, but on the contrary, the example embodiments are to cover all modifications, equivalents, and alternatives thereof. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments of the invention. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Figure 2:
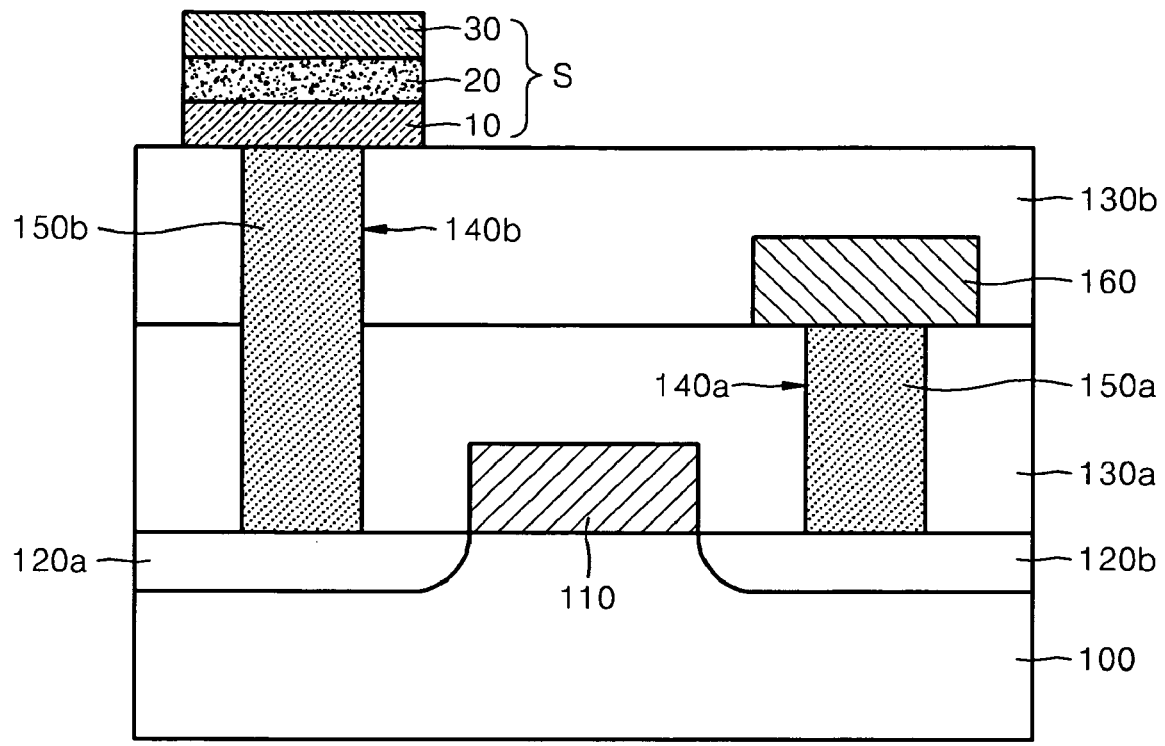
FIG. 2 is a cross-sectional view illustrating an RRAM device according to an example embodiment.

FIG. 2 illustrates a resistive random access memory (RRAM) device according to an example embodiment.

Referring to FIG. 2, a gate 110 may be disposed on a substrate 100, and a first and a second impurity region 120$a$ and 120$b$ may be disposed in the substrate 100 on both sides of the gate 110. One of the first and the second impurity regions 120$a$ and 120$b$ is a source and the other is a drain. The gate 110 and the first and the second impurity regions 120$a$ and 120$b$ may constitute a transistor. A first interlayer insulation layer 130$a$ covering the transistor may be formed on the substrate 100. A first contact hole 140$a$, to expose the second impurity region 120$b$, may be formed in the first interlayer insulation layer 130$a$ and may be filled with a first conductive plug 150$a$. A bit line 160 covering an exposed portion of the first conductive plug 150$a$ may be formed on the first interlayer insulation layer 130$a$. A second interlayer insulation layer 130$b$ may be formed on the first interlayer insulation layer 130$a$ to cover the bit line 160. A second contact hole 140$b$ may be formed in the first and the second interlayer insulation layers 130$a$ and 130$b$ to expose the first impurity region 120$a$ and the second contact hole 140$b$ may be filled with a second conductive plug 150$b$. A storage node S, covering an exposed portion of the second conductive plug 150$b$, may be formed on the second interlayer insulation layer 130$b$. The storage node S may have a structure in which a lower electrode 10, a resistance change layer 20, and/or an upper electrode 30 may be sequentially deposited.

A voltage may be applied to the lower electrode 10 according to the voltage applied to the gate 110 and the bit line 160, and the resistance of the resistance change layer 20 may be changed according to the voltage applied to the lower electrode 10 and the upper electrode 30.

Hereinafter, the storage node S included in the RRAM device of example embodiments is described in more detail.

The storage node S may include the lower electrode 10, the resistance change layer 20 and the upper electrode 30, where the resistance layer 20 is a $Cu_{2-X}O$ layer ($0 \leq X \leq 0.5$). One of the lower and upper layers 10 and 30 may be a TiN layer or a TaN layer. However, one of the lower layers 10 and the upper layers 30 may also be one of a Pt layer, an Al layer and a Ru layer. The lower electrode 10, the resistance change layer 20, and/or the upper electrode 30 may form a dot-shaped pattern having a width similar to that illustrated in FIG. 2. However, the structure of the storage node S may be changed in various forms.

For example, the lower electrode 10 and the upper electrode 30 may form line-shaped patterns perpendicular to each other, and the resistance change layer 20 may form a line-shaped pattern parallel to the lower electrode 10 or the upper electrode 30.

Hereinafter, a method of forming the storage node S included in the RRAM of an example embodiment is explained.

Figure 3:
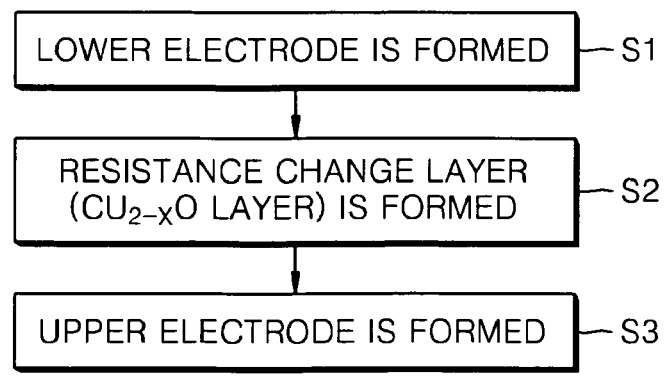
FIG. 3 shows a flowchart of a method of forming a storage node included in an RRAM device according to an example embodiment.

FIG. 3 illustrates flowchart of an example method of forming the storage node S of FIG. 2.

Referring to FIG. 3, a lower electrode may be formed in operation S1.

In operation S2, a resistance change layer may be formed on the lower electrode. The resistance change layer may be a $Cu_{2-X}O$ layer. The $Cu_{2-X}O$ layer may be formed by an RF sputtering method, for example, and a $Cu_2O$ target and Ar gas (or Ar and $N_2$ mixture gas) may be used. The pressure in the chamber in which the RF sputtering is performed may be 0.1 through 100 mtorr. Ar gas (or a sum of Ar and $N_2$ mixture gas) may be provided at a maximum amount of approximately 100 sccm. The composition of the $Cu_{2-X}O$ layer may be adjusted by changing the pressure in the chamber, the amount of Ar gas, and/or the level of RF power. Along with the Ar gas, $N_2$ gas may be provided in the chamber at a maximum amount of approximately 3 sccm. The crystallization characteristic of the $Cu_{2-X}O$ layer may be controlled by the amount of $N_2$ gas.

Because the resistance change layer (the $Cu_{2-X}O$ layer) may be formed by RF sputtering and not by a reactive sputtering in example embodiments, the reproducibility of the resistance change layer (the $Cu_{2-X}O$ layer) may be improved and the manufacturing process may be simplified.

In addition, the $Cu_{2-X}O$ layer ($0 \leq X \leq 0.5$) may have a different crystal structure and properties from those of a $CuO_{1-Y}$ layer ($0.01 \leq Y \leq 0.5$). The $CuO_{1-Y}$ layer may be formed by a reactive sputtering method using a Cu target and $O_2$ gas.

After the $Cu_{2-X}O$ layer is formed, an upper electrode may be formed on the $Cu_{2-X}O$ layer in operation S3.

At least one of the lower and the upper electrodes may be formed of any one of TiN, TaN, Pt, Al and Ru, and may be formed of TiN or TaN. A chemical vapor deposition (CVD) or a physical vapor deposition (PVD) process may be used to form the lower and/or the upper electrodes, for example.

Also, when forming the storage node S, the lower electrode and/or the resistance change layer and/or the upper electrode may be patterned in an appropriate form between the first operation S1 and the second operation S2, or between the second operation S2 and the third operation S3, or after the third operation S3.

The resistance change layer 20 formed of $Cu_{2-x}O$ may have the same crystal orientation as the lower electrode 10 and/or the upper electrode 30 in the storage node S included in the RRAM of example embodiments.

Figure 4A:
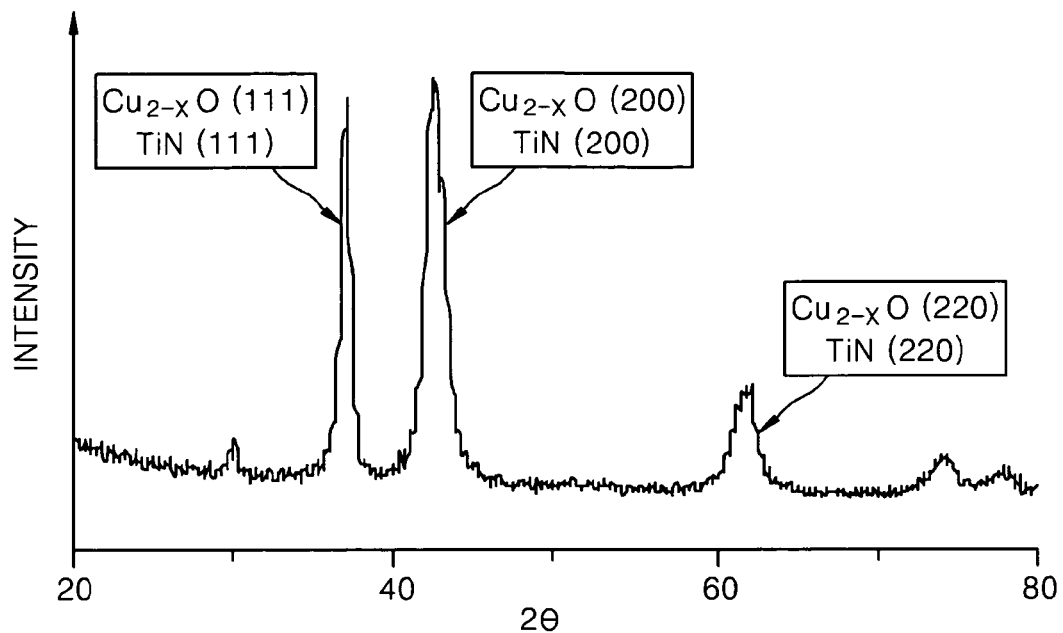
FIGS. 4A and 4B are graphs showing a result of an X-Ray Diffraction (XRD) analysis on an electrode and a resistance change layer formed by a method of forming a storage node included in an RRAM device according to an example embodiment.
Figure 4B:
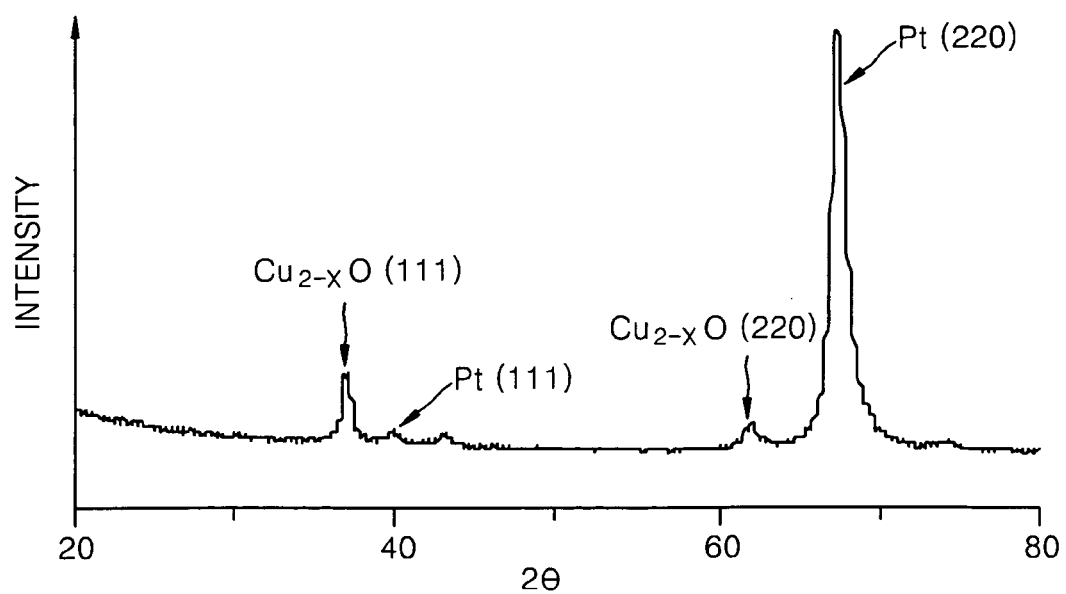

FIGS. 4A and 4B are example graphs showing a result of XRD analysis on the electrodes and the resistance change layer. FIG. 4A shows an example result from a first sample in which the $Cu_{2-x}O$ resistance change layer is formed on a TiN electrode, and FIG. 4B shows a result from a second sample in which the $Cu_{2-x}O$ resistance change layer is formed on a Pt electrode.

FIG. 4A shows peaks (111), (200) and (220) in the case of the TiN electrode, and peaks (111), (200) and (220) in the case of the $Cu_{2-x}O$ resistance change layer.

FIG. 4B shows peaks (111) and (220) of the Pt electrode and peaks (111) and (220) of the $Cu_{2-x}O$ resistance change layer.

From the above XRD result, it may be shown that the resistance change layer formed by the method of example embodiments has the same crystal orientation as the electrode formed thereunder.

Figure 5:
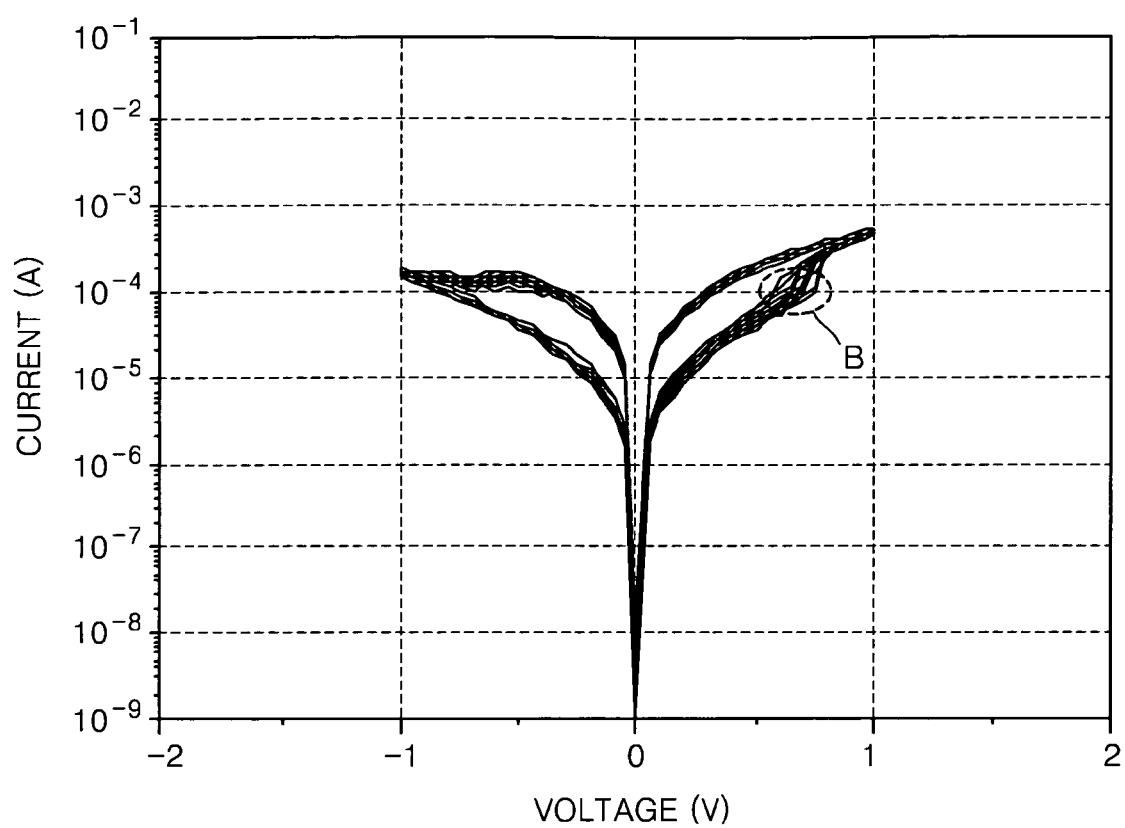
FIG. 5 is a graph showing a current-voltage characteristic of an RRAM device according to an example embodiment.

FIG. 5 is a graph showing a current-voltage characteristic of the RRAM of an example embodiment, wherein the lower electrode 10 and the upper electrode 30 of the storage node S are TiN layers.

Referring to FIG. 5, RRAMs of example embodiments may have two distinctly different resistance statuses within a range of approximately 0.1 V to 0.7 V, and thus the RRAM device may have an improved switching characteristic. Also, the change range of the graph in area B may not be very wide which may indicate that the distribution of voltages starting resistance change in the two resistance statuses may not be broad. Therefore, the RRAM device of example embodiments may have better reliability than the conventional RRAM.

As described above, the RRAM device according to an example embodiment may have a $Cu_{2-x}O$ layer as a resistance change layer 20, and one of a TiN layer, a TaN layer, a Pt layer, an Al layer and a Ru layer as a lower electrode 10 and/or an upper electrode 30. Thus the distribution of voltages causing resistance change may be reduced, thereby improving the reliability thereof.

Because the resistance change layer 20 may be formed by an RF sputtering method, and not by a reactive sputtering method, the reproducibility of the resistance change layer 20 may be improved and/or the manufacturing process may be simplified.

Furthermore, the TiN layer, TaN layer and Al layer which may be used as the lower and/or upper electrodes may be more easily etched by a general dry etching method.

While example embodiments have been particularly shown and described with reference to figures, example embodiments may, however, be embodied in many different forms and should not be construed as being limited to the embodiments set forth herein. For example, as may be understood by those of ordinary skill in the art, elements of the RRAM device of example embodiments, including the storage node S, may be varied and the structure of the RRAM, including the storage node S, may be changed. Therefore, the scope of the example embodiments should be defined not by example embodiments but by the following claims.

What is claimed is:

1. A storage node comprising:
    a first electrode and a second electrode; and
    a resistance change layer formed of $Cu_{2-x}O$ and being a single layer structure, the resistance change layer being between the first electrode and the second electrode, wherein
    a first surface of the resistance change layer directly contacts a surface of the first electrode,
    a second surface of the resistance change layer directly contacts a surface of the second electrode, and
    the first surface of the resistance change layer is opposite the second surface of the resistance change layer.

2. The storage node of claim 1, wherein X in the $Cu_{2-x}O$ is in a range of $0 \leq X \leq 0.5$.

3. The storage node of claim 1, wherein at least one of the first electrode and the second electrode is one of a TiN layer, a TaN layer, a Pt layer, an Al layer and a Ru layer.

4. The storage node of claim 1, wherein a crystal orientation of the resistance change layer is the same as a crystal orientation of at least one of the first electrode and the second electrode.

5. A resistive random access memory device comprising:
    the storage node of claim 1; and
    a switching device connected to the storage node.

6. The resistive random access memory device of claim 5, wherein X in the $Cu_{2-x}O$ is in a range of $0 \leq X \leq 0.5$.

7. The resistive random access memory device of claim 5, wherein at least one of the first electrode and the second electrode is one of a TiN layer, a TaN layer, a Pt layer, an Al layer and a Ru layer.

8. The resistive random access memory device of claim 5, wherein a crystal orientation of the resistance change layer is the same as a crystal orientation of at least one of the first electrode and the second electrode.

9. A method of manufacturing a storage node, the method comprising:
    forming a first electrode;
    forming a resistance change layer consisting of $Cu_{2-x}O$ as a single layer structure, on the first electrode; and
    forming a second electrode on the resistance change layer, wherein
    a first surface of the resistance change layer directly contacts a surface of the first electrode,
    a second surface of the resistance change layer directly contacts a surface of the second electrode, and
    the first surface of the resistance change layer is opposite the second surface of the resistance change layer.

10. The method of claim 9, wherein the resistance change layer is formed by a non-reactive sputtering method.

11. The method of claim 9, wherein the resistance change layer is formed by a radio frequency (RF) sputtering method.

12. The method of claim 11, further comprising providing $Cu_2O$ as a target material in the RF sputtering method.

13. The method of claim 11, further comprising providing Ar gas or a mixed gas of Ar gas and $N_2$ gas in the RF sputtering method.

14. The method of claim 9, wherein X of the $Cu_{2-x}O$ is in a range of $0 \leq X \leq 0.5$.

15. The method of claim 9, wherein forming the storage node includes forming at least one of the first electrode and the second electrode of any one selected from TiN, TaN, Pt, Al and Ru.

16. The method of claim 9, wherein forming the storage node includes forming at least one of the first electrode and the second electrode by chemical vapor deposition (CVD) or physical vapor deposition (PVD).

17. The method of claim 11, further comprising providing a pressure of 0.1 mtorr-100 mtorr in a pressure chamber.

18. A method of manufacturing a resistive random access memory device comprising:
    forming the storage node by the method of claim 9; and
    forming a switching device connected to the storage node.

19. The method of claim 18, wherein the resistance change layer is formed by a non-reactive sputtering method.

20. The method of claim 18, wherein the resistance change layer is formed by a radio frequency (RF) sputtering method.

21. The method of claim 18, wherein X of the $Cu_{2-X}O$ is in a range of $0 \leq X \leq 0.5$.

22. The method of claim 18, wherein forming the storage node includes forming at least one of the first electrode and the second electrode of any one selected from TiN, TaN, Pt, Al and Ru.

23. A resistive random access memory device comprising:
    a switching device; and
    a storage node connected to the switching device, wherein the storage node includes,
        a first electrode and a second electrode; and
        a resistance change layer being a single layer structure formed of $Cu_{2-X}O$, the resistance change layer being between the first electrode and the second electrode, wherein
    X of the $Cu_{2-X}O$ is in a range of $0 < X \leq 0.5$,
    a first surface of the resistance change layer directly contacts a surface of the first electrode,
    a second surface of the resistance change layer directly contacts a surface of the second electrode, and
    the first surface of the resistance change layer is opposite the second surface of the resistance change layer.

24. A resistive random access memory device comprising:
    a switching device; and
    a storage node connected to the switching device, wherein the storage node includes,
        a first electrode and a second electrode; and
        a resistance change layer being a single layer structure formed of $Cu_{2-X}O$, the resistance change layer being between the first electrode and the second electrode, wherein
            a crystal orientation of the resistance change layer is the same as a crystal orientation of at least one of the first electrode and the second electrode,
            a first surface of the resistance change layer directly contacts a surface of the first electrode,
            a second surface of the resistance change layer directly contacts a surface of the second electrode, and
            the first surface of the resistance change layer is opposite the second surface of the resistance change layer.

25. The storage node of claim 1, wherein the single layer structure consists entirely of a single compound.

* * * * *